US012754486B2

(12) United States Patent
Zschäck et al.

(10) Patent No.: US 12,754,486 B2
(45) Date of Patent: Oct. 6, 2026

(54) SCREW TRANSMISSION DRIVE, AND RETICLE STAGE AND MEASURING DEVICE FOR SEMICONDUCTOR LITHOGRAPHY APPLICATIONS

(71) Applicant: Carl Zeiss SMT GmbH, Oberkochen (DE)

(72) Inventors: Stephan Zschäck, Weissendorf (DE); Alexander Heidenreich, Jena (DE); Ullrich Klarner, Jena (DE); Steffen Weissenberg, Rackwitz (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 99 days.

(21) Appl. No.: 18/985,884

(22) Filed: Dec. 18, 2024

(65) Prior Publication Data

US 2025/0237968 A1 Jul. 24, 2025

Related U.S. Application Data

(63) Continuation of application No. PCT/EP2023/066525, filed on Jun. 20, 2023.

(30) Foreign Application Priority Data

Jun. 27, 2022 (DE) ......................... 102022115934.5

(51) Int. Cl.
*G03F 7/00* (2006.01)
*F16F 15/04* (2006.01)
*F16H 25/20* (2006.01)

(52) U.S. Cl.
CPC .......... *G03F 7/70758* (2013.01); *F16F 15/04* (2013.01); *F16H 25/20* (2013.01);
(Continued)

(58) Field of Classification Search
CPC ............. G03F 7/70758; G03F 7/70716; G03F 7/7095; F16F 15/04; F16H 25/20;
(Continued)

(56) References Cited

U.S. PATENT DOCUMENTS 4,715,241 A * 12/1987 Lipinski .................. F16H 25/20 74/89.33
4,723,086 A * 2/1988 Leibovich ................ H02N 2/04 269/21

(Continued)

FOREIGN PATENT DOCUMENTS

CN 104595444 5/2015 ............. F16H 25/20
DE 197 42 205 3/1998 ............... G12B 1/00
(Continued)

OTHER PUBLICATIONS

International Search Report for International Application No. PCT/EP2023/066525, dated Sep. 8, 2023.

(Continued)

*Primary Examiner* — Hung V Nguyen
(74) *Attorney, Agent, or Firm* — Fish & Richardson P.C.

(57) ABSTRACT

The invention relates to a screw transmission drive, in particular for the reticle stage of a device for lithography applications, comprising a leadscrew, which has a power transmission thread and a leadscrew nut which interacts with the power transmission thread, and a controllable drive for rotating the leadscrew, wherein the leadscrew nut is connected to a leadscrew flange for connection to a component to be moved relative to the drive; the leadscrew flange has two connection elements for connecting, respectively, to the leadscrew nut and to the component to be moved, the connection elements being connected by six elastically deformable struts of identical length which are fixedly clamped at both ends; the clamping points of the struts at the connection elements are distributed, in two parallel connec- (Continued)

tion planes, in pairs at regular intervals over respective connection circles such that each pair of mutually adjacent struts includes an angle; the ratio of the radii of the two connection circles is 0.5, and the connection circles are coaxially located on a common longitudinal axis. The invention also relates to a reticle stage and to a device having a reticle stage, the reticle stage having a screw transmission drive according to the invention.

20 Claims, 5 Drawing Sheets

(52) U.S. Cl.
CPC ........ *G03F 7/70716* (2013.01); *G03F 7/7095* (2013.01); *F16H 2025/2075* (2013.01)

(58) Field of Classification Search
CPC ......... F16H 2025/2075; F16H 25/2204; F16H 2025/2037
See application file for complete search history.

(56) References Cited

U.S. PATENT DOCUMENTS

| | | | |
|---|---|---|---|
| 2003/0167866 | A1 | 9/2003 | Durschmied |
| 2013/0271743 | A1 | 10/2013 | Morohashi et al. |
| 2015/0345600 | A1 | 12/2015 | Garrec et al. |

FOREIGN PATENT DOCUMENTS

| | | | |
|---|---|---|---|
| DE | 202008018123 | 3/2012 | A45B 25/14 |
| JP | 2017-067197 | 4/2017 | F16H 25/20 |
| WO | WO 02/021019 | 3/2002 | F16H 25/20 |
| WO | WO 2008/082301 | 7/2008 | F16H 25/22 |
| WO | WO 2014/128178 | 8/2014 | F16H 25/20 |
| WO | WO-2017211465 A1 * | 12/2017 | F16H 25/20 |

OTHER PUBLICATIONS

Office Action issued by the German Patent Office for Application No. DE 10 2022 115 934.5, dated Mar. 8, 2023.

* cited by examiner

SCREW TRANSMISSION DRIVE, AND RETICLE STAGE AND MEASURING DEVICE FOR SEMICONDUCTOR LITHOGRAPHY APPLICATIONS

CROSS-REFERENCE TO RELATED APPLICATIONS

The present patent application is a continuation of and claims benefit under 35 U.S.C. § 120 from PCT Application No. PCT/EP2023/066525, filed on Jun. 20, 2023, which claims priority to German Patent Application No. DE 10 2022 115 934.5, filed on Jun. 27, 2022. The entire contents of the above applications are incorporated herein by reference.

TECHNICAL FIELD

The invention relates to a screw transmission drive, in particular for the reticle stage of a device for lithography applications, and a correspondingly equipped reticle stage and device for semiconductor lithography applications.

BACKGROUND

Semiconductor components are regularly produced with the aid of lithography, in which a mask—also called reticle—illuminated by an exposure device is projected with reduced size by a projection optical unit onto a wafer equipped with a light-sensitive layer—the so-called resist. The structure predefined by the mask is subsequently implemented in the wafer by etching methods.

Particularly if the exposure is carried out using radiation in the EUV range (i.e. wavelengths in the range of between 5 nm and 30 nm), reflective masks are used in which the reflective and nonreflective structures have dimensions in the nanometers range.

In order to ensure that the desired semiconductor structure is actually attained during the exposure of a wafer, the masks are examined using specially configured devices prior to the exposure of wafers.

In this regard, mask inspection microscopes, such as for example the AIMS from Carl Zeiss SMS GmbH, can be used to check whether or not defects present will have a negative effect during the exposure of the wafer. These microscopes are equipped with imaging optical units and light sources which make possible an imaging that comes as close as possible to the behavior of the actual semiconductor lithography system.

In position measuring devices, the positions of structures on masks are determined highly accurately and the structure of a mask is projected onto a light-sensitive spatially resolved detector, such as for example a CCD chip (charge coupled device).

Moreover since the object region in the imaging optical units of the various devices for semiconductor lithography applications are regularly smaller than masks arranged therein, but owing to the required precision the imaging optical units these themselves are not suitably adjustable, it is necessary to suitably move the mask in the object plane in order to sequentially image the entire mask section by section. So-called reticle stages are used for this purpose and they can displace a mask placed thereon, the mask being held on the reticle stage solely by force-locking engagement caused by gravity, highly accurately in at least one direction.

In this regard, e.g., position measuring devices are equipped with a highly accurately positionable reticle stage, which allow a positioning of a mask placed thereon with an accuracy of below 1 nm.

Screw transmission drives can be used at least for movements of the reticle stage in a specific direction. In the case of these drives, a motor-driven rotational movement of a threaded spindle causes a spindle nut that is engaged therewith and does not corotate to move linearly in the direction of the longitudinal axis. If, e.g., motor and threaded spindle can be regarded as positionally fixed, a component connected to the spindle nut can be moved linearly in relation thereto.

Appropriate design of the screw transmission drive, particularly with regard to the thread of the threaded spindle, makes it possible in principle to realize even microscopic movements with a precision sufficient for position measuring devices.

It has been found that despite flexures optionally provided for decoupling oscillations and vibrations in the region of the spindle nut and the choice of a particularly smooth-running motor in the case of screw transmission drives, an excitation of oscillations of the reticle stage may nevertheless occur. Since a mask to be measured is merely placed on this reticle stage, the oscillations introduced in this way may cause a change in the position of the reticle on the reticle stage in the nanometers to sub-nanometers range, thereby corrupting the examination result.

SUMMARY

The present invention is therefore based on the aspect of providing a screw transmission drive, in particular for the reticle stage of a device for semiconductor lithography applications, and a reticle stage equipped therewith and a device for semiconductor lithography applications in which the disadvantages from the prior art no longer occur, or occur only to a reduced extent.

This aspect is achieved by devices as claimed in the independent claims. The dependent claims relate to advantageous developments.

Accordingly, the invention relates to a screw transmission drive, in particular for the reticle stage of a device for lithography applications, comprising a threaded spindle having a movement thread and a spindle nut that interacts with the movement thread, and a controllable drive for rotating the threaded spindle, wherein the spindle nut is connected to a spindle flange for linking to a component to be moved relative to the drive, wherein the spindle flange comprises two linking elements for connection respectively to the spindle nut or the component to be moved, the linking elements being connected by six elastically deformable struts of identical length which are fixedly clamped at both ends, wherein the clamping points of the struts at the linking elements are arranged in a manner distributed in two parallel linking planes in respective pairs at regular spacings over a respective linking circle in such a way that two mutually adjacent struts in each case form an angle, wherein the ratio of the radii of the two linking circles is 0.5, and the linking circles are arranged coaxially on a common longitudinal axis.

Furthermore, the invention relates to a reticle stage for a mask for semiconductor lithography applications, comprising a stage mirror for placing a mask thereon, the stage mirror being displaceable in at least one direction by a respective drive, wherein at least one drive of the stage mirror is a screw transmission drive according to the invention.

The invention also relates to a device for semiconductor lithography applications, comprising a reticle stage according to the invention.

The screw drive according to the invention is distinguished by a particular design of the securing of the spindle nut to the component to be moved which makes it possible in particular for vibrations and oscillations in a radial direction of the threaded spindle to be kept away from the component to be moved.

For this purpose, the invention provides a spindle flange having two linking elements, of which one linking element is connected or connectable to the spindle nut and the other linking element is connected or connectable to the component to be moved. The two linking elements themselves are interconnected by six struts which, owing to their particular arrangement, on the one hand enable a high stiffness of the spindle flange in an axial longitudinal direction of the spindle flange, but at the same time also permit a relative movement of the two linking elements in a radial direction with respect thereto. This last enables the transmission of a radial movement or oscillation of one linking element to the other linking element to be at least significantly reduced.

For this purpose, one end of each of the six struts is fixedly clamped at the two linking elements in terms of statics, that is to say that the struts are secured to the linking elements in such a way as to prevent all displacements and rotations at the securing point. In this case, the clamping points of all the struts are situated on a respective linking circle on two parallel linking planes spaced apart from one another by a height, that is to say that for each linking element it is possible to find a circle on a plane on which all the clamping points at this linking element are situated. In particular, the axes of the struts are also situated at the relevant clamping points on a linking circle. The two linking circles are arranged coaxially in the non-loaded state of the spindle flange, that is to say that the midpoints of the two linking circles are situated on a common axis perpendicular to the parallel linking planes. This axis corresponds to the longitudinal axis of the spindle flange as already mentioned above.

The length of the six struts is chosen in such a way that the clamping points are arranged on the two linking circles in respective pairs directly adjacent to one another, wherein these clamping points in respective pairs are distributed in each case uniformly over the circumference of the respective linking circle. In this case, directly adjacent clamping points can also wholly or partly coincide, in which case the struts, in the clamping point region, then either are designed in one piece or have a suitable shaping allowing a corresponding close or common clamping.

Since two mutually adjacent struts at the same time are intended in each case to form an angle with respect to one another, i.e. are therefore not arranged parallel, the struts ultimately produce a pattern such as is known in a similar form from the hydraulic cylinders of a hexapod, though the hydraulic cylinders are variable in length and linked at both ends only to fixed bearings in terms of statics—at least in the case where all the hydraulic cylinders of the hexapod are adjusted to the same length.

In the case of the spindle flange according to the invention, provision is furthermore made for the radius of one linking circle to be only half the radius of the other linking circle, i.e. for the ratio of the two radii to one another to be 0.5.

For the particular design of the spindle flange described in the present case, it has been found that even with high stiffness in an axial direction the spindle flange can permit relatively small displacements of the two linking elements in a radial direction; the transverse stiffness relevant to this can be set by way of a suitable choice of the diameters of the six struts, which at the same time only slightly influences the axial stiffness. If relatively small radial displacements of the two linking elements are permitted, a certain decoupling between the two linking elements is attained which does not transmit radially acting oscillations and vibrations between the two linking elements, or transmits them only in attenuated fashion.

The spindle flange according to the invention is furthermore distinguished by the fact that a possible radial displacement of the two linking elements with respect to one another takes place exclusively as a lateral parallel offset at least to a certain extent, i.e. the planes, in which the respective linking circles are situated, remain parallel even in the case of such a displacement and absolutely no angular offset or the like arises.

The extent to which a radial transverse displacement takes place exclusively as a parallel displacement is dependent in other words on the length of the struts, the height of the spindle flange (i.e. the spacing between the two spacing planes), and the stiffness of the struts. The latter is dependent inter alia on the diameter of the struts and the modulus of elasticity, where it has been found that the diameter of the struts has a greater influence on the transverse stiffness than on the axial stiffness. By way of a suitable choice of the abovementioned parameters, which can be arrived at straightforwardly by a person skilled in the art through calculation, simulation or experiments, a spindle flange suitable in each case for a large number of different applications can be designed and produced which satisfies desired requirements in respect of axial and transverse stiffness, with which on the one hand a precisely operable screw transmission drive for a component can be attained, but on the other hand the transmission of vibrations and oscillations to the component to be moved can also be reduced. It is preferred here if all six struts are embodied identically, i.e. besides an identical length (which in principle already results from the other geometric stipulations for the spindle flange) also have an identical cross section, in particular a circular cross section having an identical diameter, and are fabricated from the same material, i.e. therefore have an identical modulus of elasticity.

Preferably, the axis of the threaded spindle coincides with the axis of the spindle flange. This can accordingly be attained by way of a suitable linking of the spindle nut to one linking element. If the two axes run coaxially, this ensures that the axial forces to be transmitted for a desired movement of a component via the spindle flange in principle do not introduce any moments into the spindle flange.

It is preferred if at least one linking element, preferably both linking elements, has/have a leadthrough opening for the threaded spindle. While a corresponding leadthrough opening will regularly be required for the linking element to which the spindle nut is connected, in order to ensure the functionality of the screw transmission drive, a leadthrough opening in the other linking element in principle makes possible a movement range of the screw transmission drive significantly beyond the height of the spindle flange—this is because without a corresponding leadthrough opening, the other linking element would constitute a stop for the threaded spindle and thus predefine the maximum lateral movement of the screw transmission drive. The leadthrough opening at the other linking element should be chosen to be large enough to make it possible not only to lead the threaded spindle through it but also to enable the above-described lateral parallel displacement of the two linking elements with respect to one another.

Preferably, the radius of the linking circle at the linking element connected to the spindle nut is smaller than the radius of the linking circle at the other linking element. As a result, the linking element connected to the spindle nut can regularly be made smaller and lighter, which is advantageous for the oscillation properties of the spindle flange.

Given a suitable design of the spindle flange and in particular a suitable choice of the diameter of the struts, it is possible to dispense with additional decoupling elements, such as the flexures known from the prior art, as a result of which the mass in the region of the spindle nut can be reduced further. The connection between spindle nut and linking element is therefore preferably flexure-free.

For further reduction of the mass in the region of the spindle nut, it is alternatively or additionally possible to design the spindle nut in one piece with the linking element provided for the spindle nut.

Threaded spindle and spindle nut are preferably designed for forming a ball screw drive. A ball screw drive and the requisite design of threaded spindle and spindle nut are sufficiently known to a person skilled in the art and need no further explanation here. A ball screw drive is distinguished by particularly high precision when the spindle nut is displaced along the threaded spindle.

The spindle flange can be fabricated in one piece and/or from one material. It is preferred if in particular the linking element connected to the spindle nut is of as lightweight design as possible. This linking element—but also the other linking element—can therefore be fabricated from aluminum or plastic, e.g., polytetrafluoroethylene (PTFE) or polyamide-imide, the material preferably being electrically conductive in order to avoid static charging. For the struts, preferred material is steel, preferably having a modulus of elasticity of between 150 $kN/mm^2$ and 300 $kN/mm^2$, preferably between 200 $kN/mm^2$ and 250 $kN/mm^2$, more preferably between 215 $kN/mm^2$ and 225 $kN/mm^2$.

In the case of the reticle stage according to the invention, which can be configured in principle in a manner comparable to a reticle stage known from the prior art—in particular also with one or more screw transmission drives for moving the reticle stage—the use of at least one screw transmission drive according to the invention for displacing the reticle stage in, e.g., a respective direction is provided. Owing to the reduction achieved in the screw transmission drive according to the invention in regard to the transmission of radially acting oscillations and vibrations to the reticle mirror, the risk of a mask placed thereon slipping even just in the nanometers or sub-nanometers range is significantly reduced.

This very advantage is also used in the device according to the invention, in which a reticle stage according to the invention is used. Irrespective of the semiconductor lithography application for which the device is ultimately configured, the risk of incorrect measurements and/or incorrect exposures owing to masks moved unintentionally even just in the nanometers or sub-nanometers range is reduced.

BRIEF DESCRIPTION OF THE DRAWINGS

The invention will now be described by way of example on the basis of an advantageous embodiment with reference to the accompanying drawings, in which.

DETAILED DESCRIPTION

Figure 1:
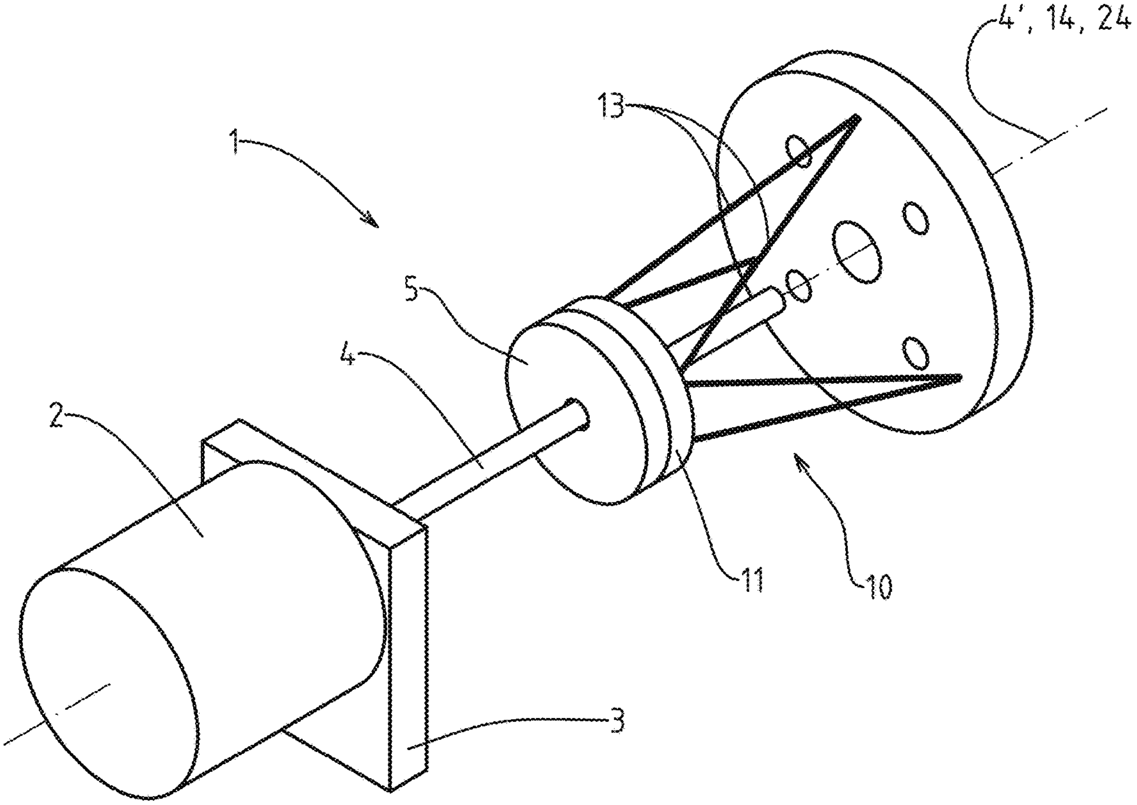
FIG. 1: shows an exemplary embodiment of a screw transmission drive according to the invention.

A screw transmission drive 1 according to the invention is illustrated schematically in FIG. 1.

The screw transmission drive 1 comprises a smooth-running servomotor 2 as a controllable drive, which can drive a threaded spindle 4, specifically rotate it about its longitudinal axis 4', the threaded spindle being mounted rotatably in a positionally fixedly securable bearing block 3. The threaded spindle 4 has a movement thread (not illustrated), the corresponding helical groove being shaped with a half-round cross section such as is known for a ball screw drive.

A spindle nut 5 interacts with the movement thread of the threaded spindle 4, the spindle nut likewise having a helical groove with a half-round cross section, though the groove is closed off on both sides. Balls (not visible) are arranged in the spiral channel formed by threaded spindle 4 and spindle nut 5, the balls allowing a rotational movement of the threaded spindle 4 to be converted into a translational movement of the spindle nut 5 along the threaded spindle 4 or the axis 4' thereof.

For linking the spindle nut 5 to a component 104 to be moved (cf. FIG. 4), which is intended to be moved relative to the bearing block 3 in the direction of the axis 4' of the threaded spindle 4 with the aid of the screw transmission drive 1, a spindle flange 10 is provided.

The spindle flange 10 has two linking elements 11, 12 connected to one another via six struts 13. In this case, one linking element 11 is fixedly connected to the spindle nut 5, while the other linking element 12 is provided for connection to the component 104 to be moved (cf. FIG. 4).

The spindle flange 10 will now be explained in greater detail with reference to FIG. 2, in which the spindle flange 10 is illustrated in isolation, and FIG. 3, in which the essential geometry of the spindle flange is illustrated as a basic schematic diagram.

The mutually facing surfaces 11', 12' of the two linking bodies 11, 12 form respective linking planes 20 running parallel to one another. Respective linking circles 21 are defined on these two linking planes 20, the radius of the linking circle 21 at one linking body 11 being exactly half, i.e. a factor of 0.5 smaller than, the radius of the linking circle 21 at the other linking body 12. In the exemplary embodiment illustrated, the linking circle 21 at the linking body 11 connected to the spindle nut 5 (cf. FIG. 1) has the smaller radius in this case.

The two linking circles 21 are arranged coaxially on an axis 22, which is also regarded as a longitudinal axis 14 of the spindle flange 10. In the complete screw transmission drive 1, the longitudinal axis 14 of the spindle flange 10 is moreover arranged coaxially with respect to the axis 4' of the threaded spindle 4 (cf. FIG. 1).

Figure 3:
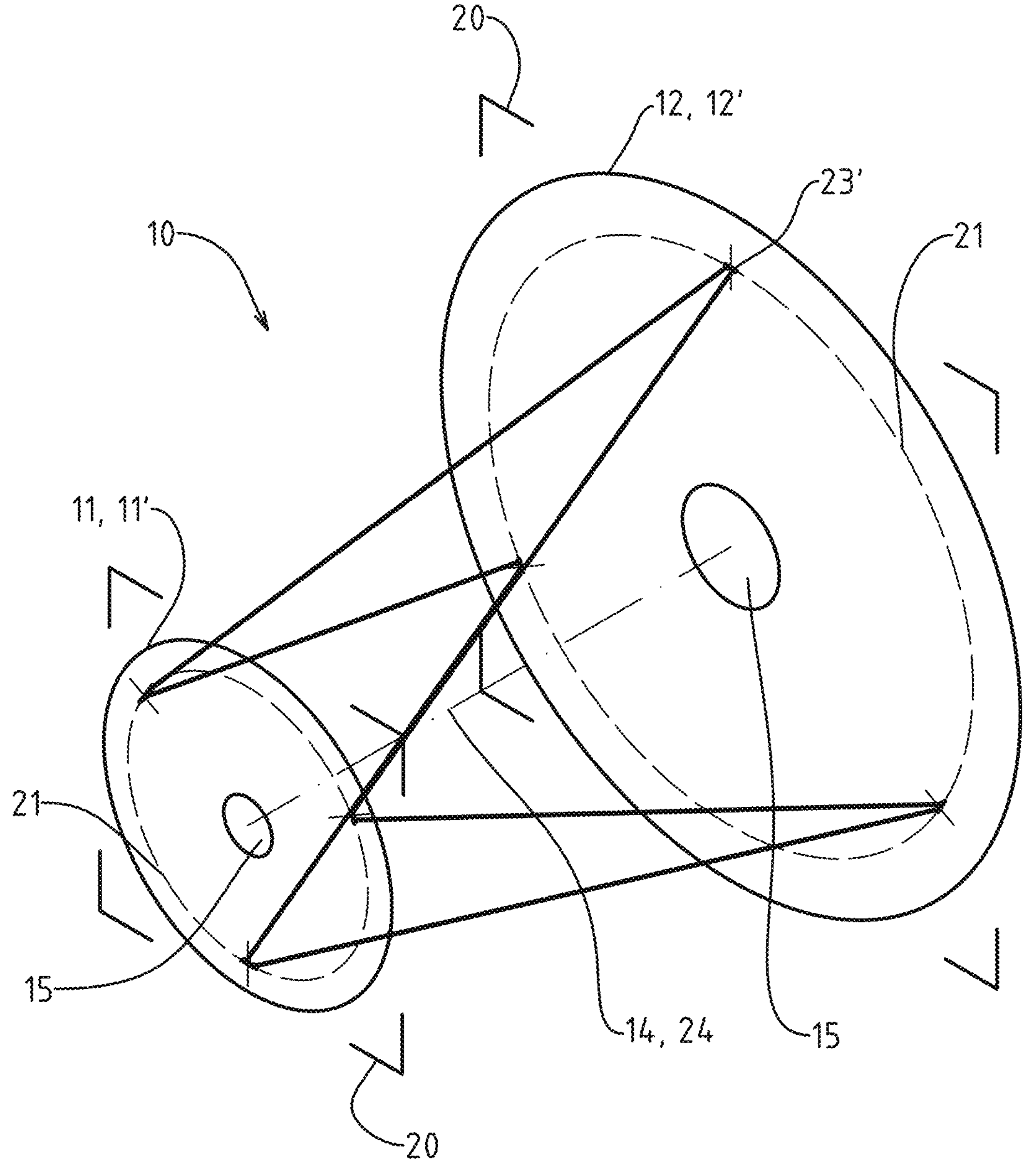
FIG. 3: shows a basic schematic diagram of the spindle flange from FIG. 2.

The six struts 13 connecting the two linking bodies 11, 12, the struts being configured identically to one another, are fixedly clamped at both ends in terms of statics (cf. the symbolic illustration of the bearings 23' of the struts 13 illustrated as rods 23 in FIG. 3). In this case, the clamping points 23' of the rods 23, representing the axes of the struts 13, are respectively arranged on the linking circles 21.

In this case, the clamping points 23' are arranged in respective pairs, that is to say that the clamping points 23' of two adjacent rods 23 or struts 13 are respectively arranged directly next to one another. The clamping points 23' in pairs are in this case uniform over the circumference of the respective linking circles 21, the pairwise combination of the clamping points 23' being chosen such that two adjacent rods 23 or struts 13 in each case run at an angle with respect to one another.

The identical length of the rods 23 or struts 13 gives rise to the regular arrangement of the rods 23 or struts 13 that is evident in all the figures, the arrangement in principle being similar to the arrangement of the six hydraulic cylinders in known hexapods. It goes without saying, however, that in contrast to hydraulic cylinders, the struts 13 are not variable in length and in addition the struts 13 are fixedly clamped—and not for instance with fixed bearings allowing rotations like the hydraulic cylinders in hexapods.

The struts 13 are elastically deformable, in particular bendable, at least to a certain extent. Owing to this property, the two linking elements 11, 12 can move with respect to one another in a radial direction with respect to the longitudinal axis 14, 24 despite a high axial stiffness of the spindle flange 10. In this case, owing to the geometry according to the invention, exclusively a lateral parallel displacement occurs, that is to say that even in the case of a corresponding relative movement of the two linking elements 11, 12, the linking planes 20 remain aligned parallel to one another.

By use of suitable geometry and materials, by use of the spindle flange 10 a substantial decoupling of the component 104 to be moved (cf. FIG. 4) or of the linking element 12 connected thereto and possible oscillations and vibrations of the rest of the screw transmission drive 10 which by use of the servomotor 2 can however, e.g., also be introduced into the system by use of a non-exact axiality of the threaded spindle 4, can be achieved. This decoupling that is able to be realized solely by use of the spindle flange 10 can even go as far as making it possible to dispense with a flexure between the spindle nut 5 and the linking element 11 connected thereto, the flexure regularly being provided for decoupling oscillations at a comparable point in the prior art. This makes it possible to save mass in the region of the spindle nut 5, which improves the oscillation behavior of the screw transmission drive 10.

Even more mass can be saved, in principle, if the spindle nut 5 is configured in one piece with the linking element 11. In this embodiment variant (not illustrated), all mass of the otherwise required connecting elements of spindle nut 5 and linking element 11, such as, e.g., screws, is omitted. Moreover, a combined one-piece element can have a smaller mass than the combined mass of separately embodied spindle nut 5 and linking element 11.

In the exemplary embodiment illustrated, the struts 13 are fabricated from an X17CrNi16-2 round steel having a modulus of elasticity of 215 $kN/mm^2$ and have a diameter of 2 mm. The spacing between the two linking planes 20 is 200 mm. The respective radii of the two linking circles 21 are 50 mm and 100 mm, thereby affording the required radius ratio of 0.5. Owing to the geometric relationships, the struts 13 then have a length of 217.9 mm.

The two linking elements 11, 12 are fabricated from aluminum.

In order that the movement range of the screw transmission drive 1 is not limited by the linking elements 11, 12 as a stop for the threaded spindle 4, not only the linking element 11 but also the other linking element 12 has a leadthrough opening 15 for the threaded spindle 4, said leadthrough opening being arranged coaxially on the axis 14, 24. In this case, the diameter of the leadthrough opening 15 at least at the other linking element 12 is significantly larger than the diameter of the threaded spindle 5 itself in order that—even when the threaded spindle 5 is led through the leadthrough opening 15 of the other linking element 12—the above-described lateral parallel displacement between the linking elements 11, 12 remains possible.

Figure 2:
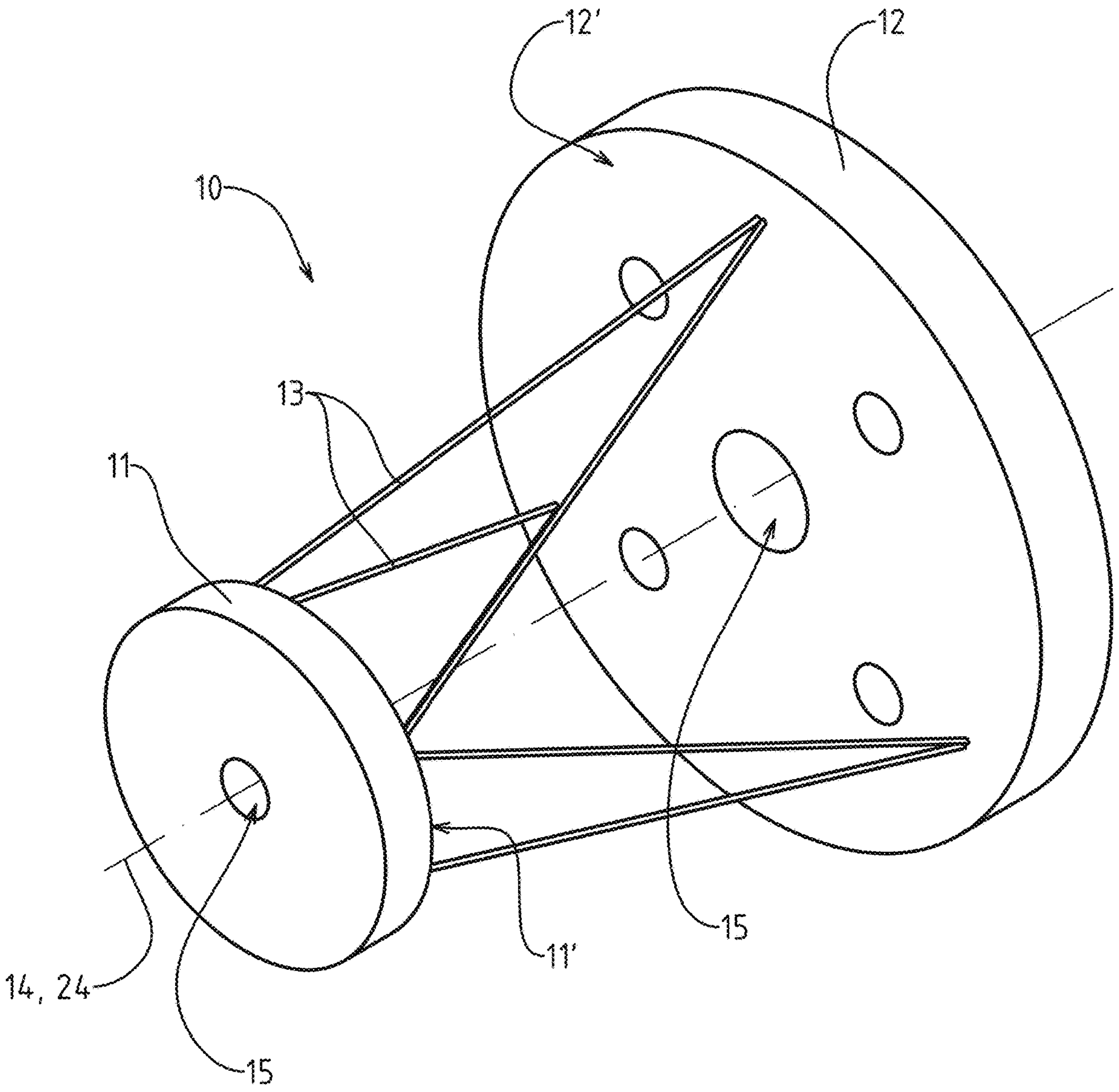
FIG. 2: shows a detail illustration of the spindle flange of the screw transmission drive from FIG. 1.
Figure 4:
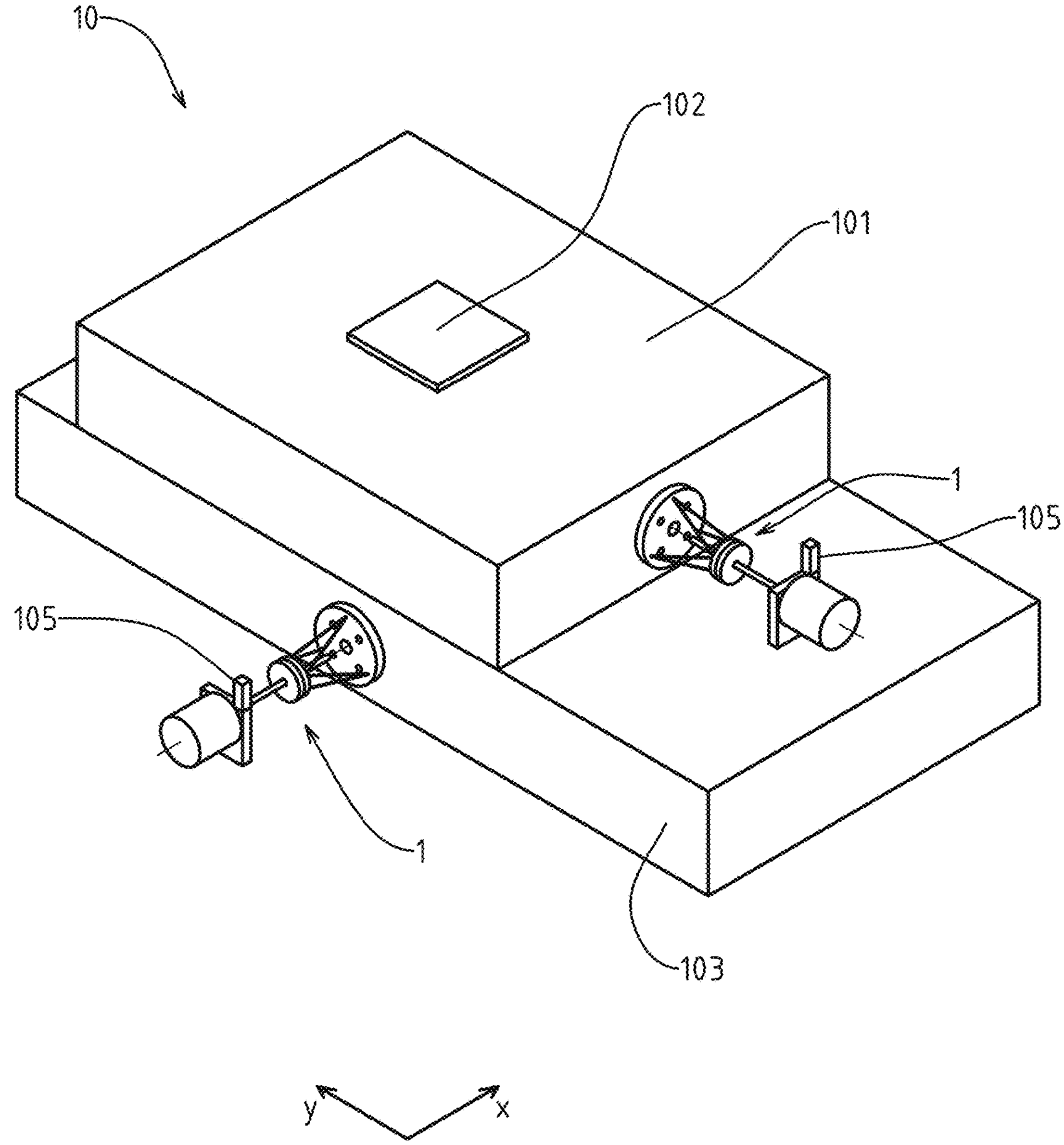
FIG. 4: shows a schematic illustration of a reticle stage comprising a plurality of screw transmission drives from FIG. 1.

The screw transmission drive 1 in accordance with FIGS. 1 to 3 is particularly suitable as a coarse drive of a reticle stage 100 such as is illustrated schematically in FIG. 4.

A reticle stage 100 serves to enable a mask 102 that has been placed on a so-called stage mirror 101 and bears thereon solely owing to gravity to be displaced highly precisely in a plane—the XY-plane in FIG. 4—in order that the mask 102 can be moved section by section through the object region—which regularly turns out to be significantly smaller than the mask 102—of a device 200 for lithography applications (cf. FIG. 5) in order that the entire mask 102 can thus be captured sequentially by the device 200.

The stage mirror 101 is arranged on a stage slide 103, wherein the stage mirror 101 can be displaced in the Y-direction on the stage slide 103 and the stage slide 103 together with the stage mirror 101 arranged thereon can be displaced in the X-direction. A respective screw transmission drive 1 as illustrated in FIGS. 1 to 3 is provided for each of these directions of movement. One screw transmission drive 1 is linked to the stage mirror 101 and the stage slide 103, while the other screw transmission drive 1 is linked to the stage slide 103 and a positionally fixed anchoring (not illustrated). Therefore, the last-mentioned screw transmission drive 1 enables the stage slide 103 connected thereto to be moved in the X-direction, while the other screw transmission drive 1 enables the stage mirror 101 to be moved relative to the stage slide 103 in the Y-direction.

In the exemplary embodiment illustrated, the screw transmission drives 1 are each also supplemented by a position sensor 105, which can be used to ascertain the position of the spindle nut 5 relative to the securing flange 3. The position sensor 105 can be configured, e.g., as a laser interferometer or as a laser rangefinder with time-of-flight measurement.

Figure 5:
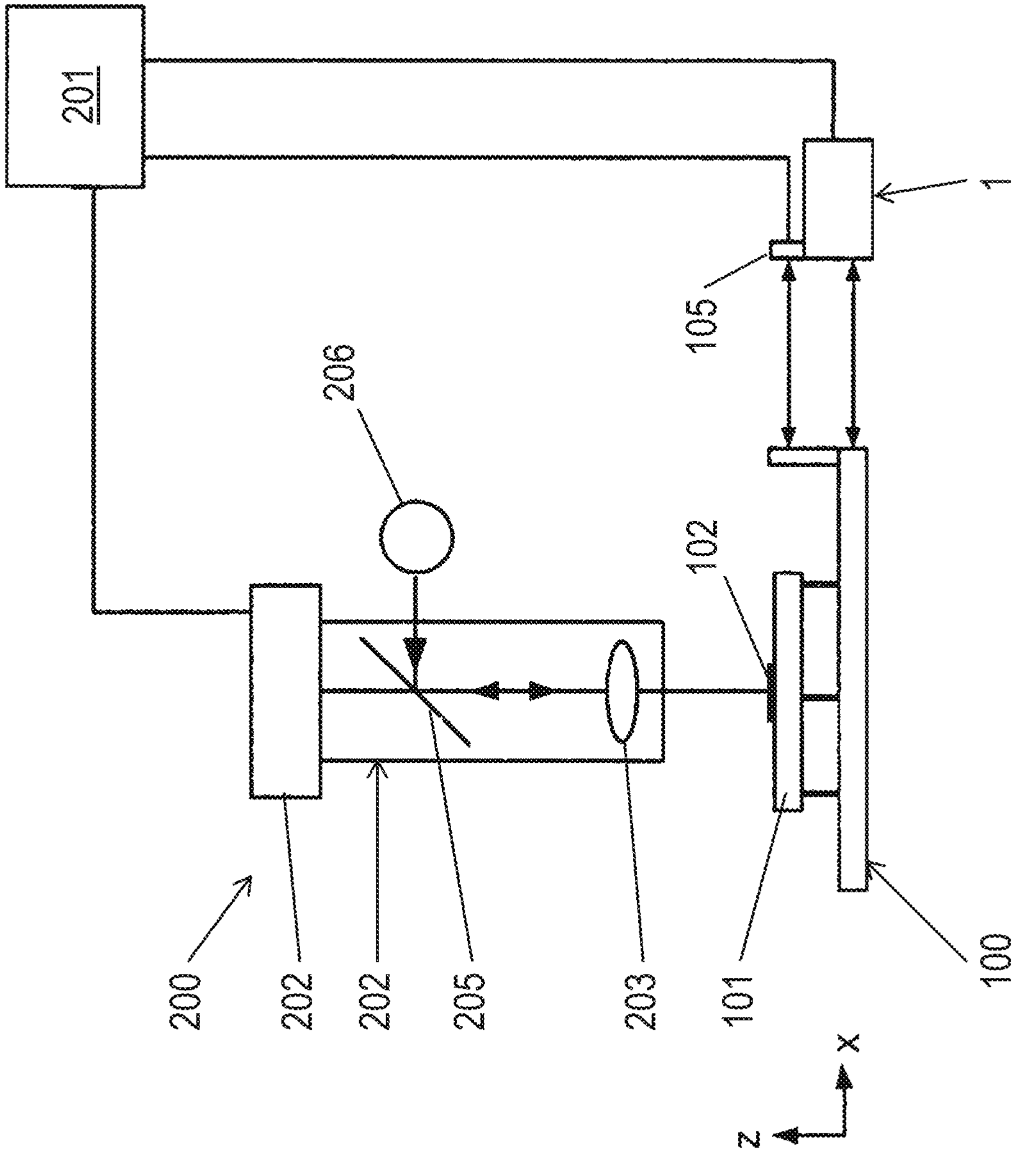
FIG. 5: shows a schematic view of a device for semiconductor lithography applications having a reticle stage in accordance with FIG. 4.

A device 200 for semiconductor lithography applications is illustrated by way of example in FIG. 5, in which device a reticle stage 100 in accordance with FIG. 4 having screw transmission drives 1 according to the invention can be used.

The device illustrated in FIG. 5 is a position measuring device such as is known from the prior art and which differs from the prior art merely in the reticle stage 100 used. It goes without saying that the reticle stage 100 can also be used in any other devices 200 for semiconductor lithography applications.

The device 200 comprises a reticle stage 100 in accordance with FIG. 4, which is illustrated only extremely schematically in FIG. 5: The reticle stage 100 comprises a reticle mirror 101 mounted on a stage slide 103. The stage slide 103 can be displaced in the X-direction—in the simplified illustration in FIG. 5—by a screw transmission drive 1, the position of the stage slide 103 being monitored by the position sensor 105. Screw transmission drive 1 and position sensor 105 are connected to an evaluation module 201, via which the screw transmission drive 1 is also controlled.

Likewise connected to the evaluation unit 201 is a recording unit 202, of which a measuring lens 203 and a detector 204 are illustrated schematically. Furthermore, the recording unit 202 comprises a beam splitter 205 and an illumination source 206, via which a mask 102 that has been placed on the reticle mirror 101 can be illuminated in such a way that the light reflected by the mask can be captured by the detector 204 and evaluated by the evaluation unit 201 in accordance with the methods known in the context of a position measuring device.

Since the recording region of the recording unit 202 is significantly smaller than the mask 102, the mask 102 is moved step by step beneath the recording unit 202 with the aid of the screw transmission drive 1, such that the complete mask 102 can be captured section by section by the recording unit 202.

Since the screw transmission drive 1 is designed according to the invention, vibrations and oscillations can be effectively kept away from the reticle mirror 101 to the greatest possible extent, and so the risk of the mask 102 that merely bears on said reticle mirror moving in the nanometers or even just sub-nanometers range, this risk existing otherwise and in particular in the prior art, is significantly reduced.

What is claimed is:

1. A screw transmission drive, in particular for the reticle stage of a device for lithography applications, comprising a threaded spindle having a movement thread and a spindle nut that interacts with the movement thread, and a controllable drive for rotating the threaded spindle, wherein the spindle nut is connected to a spindle flange for linking to a component to be moved relative to the drive, wherein the spindle flange comprises two linking elements for connection respectively to the spindle nut or the component to be moved, the linking elements being connected by six elastically deformable struts of identical length which are fixedly clamped at both ends, wherein the clamping points of the struts at the linking elements are arranged in a manner distributed in two parallel linking planes in respective pairs at regular spacings over a respective linking circle in such a way that two mutually adjacent struts in each case form an angle, wherein the ratio of the radii of the two linking circles is 0.5, and the linking circles are arranged coaxially on a common longitudinal axis.

2. The screw transmission drive of claim 1, wherein the axis of the threaded spindle coincides with the longitudinal axis of the spindle flange.

3. The screw transmission drive of claim 1, wherein at least one linking element, preferably both linking elements, has/have a leadthrough opening for the threaded spindle.

4. The screw transmission drive of claim 1, wherein the radius of the linking circle at the linking element connected to the spindle nut is smaller than the radius of the linking circle at the other linking element.

5. The screw transmission drive of claim 1, wherein the connection between spindle nut and linking element is flexure-free.

6. The screw transmission drive of claim 1, wherein the spindle nut is configured in one piece with the linking element provided for connection to the spindle nut.

7. The screw transmission drive of claim 1, wherein the threaded spindle and the spindle nut are configured for forming a ball screw drive.

8. The screw transmission drive of claim 1, wherein one or both linking element(s) is/are composed of aluminum or plastic and/or the struts are composed of steel, preferably having a modulus of elasticity of between 150 $kN/mm^2$ and 300 $kN/mm^2$, more preferably between 200 $kN/mm^2$ and 250 $kN/mm^2$, particularly preferably between 215 $kN/mm^2$ and 225 $kN/mm^2$.

9. A reticle stage for a mask for semiconductor lithography applications, comprising a stage mirror for placing a mask thereon, the stage mirror being displaceable in at least one direction by a respective drive, wherein at least one drive of the stage mirror is a screw transmission drive of claim 1.

10. A device for semiconductor lithography applications, comprising a reticle stage of claim 9.

11. The reticle stage of claim 9, wherein the axis of the threaded spindle coincides with the longitudinal axis of the spindle flange.

12. The reticle stage of claim 9, wherein at least one linking element has a leadthrough opening for the threaded spindle.

13. The reticle stage of claim 9, wherein the radius of the linking circle at the linking element connected to the spindle nut is smaller than the radius of the linking circle at the other linking element.

14. The reticle stage of claim 9, wherein the connection between spindle nut and linking element is flexure-free.

15. The reticle stage of claim 9, wherein the spindle nut is configured in one piece with the linking element provided for connection to the spindle nut.

16. The reticle stage of claim 9, wherein the threaded spindle and the spindle nut are configured for forming a ball screw drive.

17. The reticle stage of claim 9, wherein one or both linking element(s) is/are composed of aluminum or plastic and/or the struts are composed of steel, preferably having a modulus of elasticity of between 150 $kN/mm^2$ and 300 $kN/mm^2$.

18. The device of claim 10, wherein the axis of the threaded spindle coincides with the longitudinal axis of the spindle flange.

19. The device of claim 10, wherein at least one linking element, preferably both linking elements, has/have a leadthrough opening for the threaded spindle.

20. The device of claim 10, wherein the radius of the linking circle at the linking element connected to the spindle nut is smaller than the radius of the linking circle at the other linking element.

* * * * *